(12) United States Patent
Finkbeiner et al.

(10) Patent No.: US 11,380,372 B1
(45) Date of Patent: Jul. 5, 2022

(54) TRANSFERRING DATA BETWEEN DRAM AND SRAM

(71) Applicant: Micron Technology, Inc., Boise, ID (US)

(72) Inventors: Timothy P. Finkbeiner, Boise, ID (US); Troy A. Manning, Meridian, ID (US); Troy D. Larsen, Meridian, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/124,697

(22) Filed: Dec. 17, 2020

(51) Int. Cl.
*G11C 7/06* (2006.01)
*G11C 7/10* (2006.01)

(52) U.S. Cl.
CPC ............ *G11C 7/065* (2013.01); *G11C 7/1039* (2013.01); *G11C 7/1075* (2013.01); *G11C 7/1096* (2013.01)

(58) Field of Classification Search
CPC ..... G11C 7/065; G11C 7/1039; G11C 7/1075; G11C 7/1096; G11C 11/005
USPC ............................. 365/185.21, 189.17, 189.2
See application file for complete search history.

(56) References Cited

U.S. PATENT DOCUMENTS

| | | | | |
|---|---|---|---|---|
| 4,731,758 A | * | 3/1988 | Lam ...................... | G11C 11/005 365/189.05 |
| 5,544,121 A | * | 8/1996 | Dosaka .................... | G11C 7/10 365/222 |
| 5,603,009 A | * | 2/1997 | Konishi ................. | G11C 7/103 711/165 |
| 5,623,454 A | * | 4/1997 | Dosaka .................... | G11C 7/22 365/230.02 |
| 5,680,363 A | * | 10/1997 | Dosaka .................. | G11C 7/103 365/230.03 |
| 5,777,942 A | * | 7/1998 | Dosaka ............... | G06F 12/0893 365/230.03 |
| 5,946,262 A | * | 8/1999 | Randolph ............ | G11C 7/1075 365/230.05 |
| 6,088,760 A | * | 7/2000 | Walker ................ | G06F 12/0893 711/104 |
| 6,735,144 B2 | * | 5/2004 | Maesako ................. | G11C 7/103 365/230.03 |
| 2014/0177347 A1 | | 6/2014 | Chatterjee | |
| 2017/0337984 A1 | | 11/2017 | Tsern | |
| 2018/0373560 A1 | | 12/2018 | Peng | |
| 2020/0210188 A1 | | 7/2020 | Ould-Ahmed-Vall | |

* cited by examiner

*Primary Examiner* — Son L Mai
(74) *Attorney, Agent, or Firm* — Brooks, Cameron & Huebsch, PLLC

(57) ABSTRACT

Methods and devices related to transferring data between DRAM and SRAM. One method includes activating a first portion of a dynamic random access memory (DRAM), reading data from the first portion of the DRAM, latching the data from the first portion of the DRAM in one or more sense amplifiers, and writing the data from the one or more sense amplifiers to a first portion of a static random access memory (SRAM).

22 Claims, 7 Drawing Sheets

TRANSFERRING DATA BETWEEN DRAM AND SRAM

TECHNICAL FIELD

The present disclosure relates generally to semiconductor memory and methods, and more particularly, to apparatuses and methods related to transferring data between DRAM and SRAM.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), static random access memory (SRAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), 3D XPoint™, resistive random access memory (RRAM), and magnetoresistive random access memory (MRAM), among others.

Memory is also utilized as volatile and non-volatile data storage for a wide range of electronic applications, including, but not limited to personal computers, portable memory sticks, digital cameras, cellular telephones, portable music players such as MP3 players, movie players, and other electronic devices. Memory cells can be arranged into arrays, with the arrays being used in memory devices.

Computers or other electronic devices can include a number of memory devices. In some examples, different types of memory can be included on the same electronic device for optimal performance of the electronic device. However, different types of memory devices may require separate data paths and/or controls for each type of memory device.

DETAILED DESCRIPTION

Figure 1A:
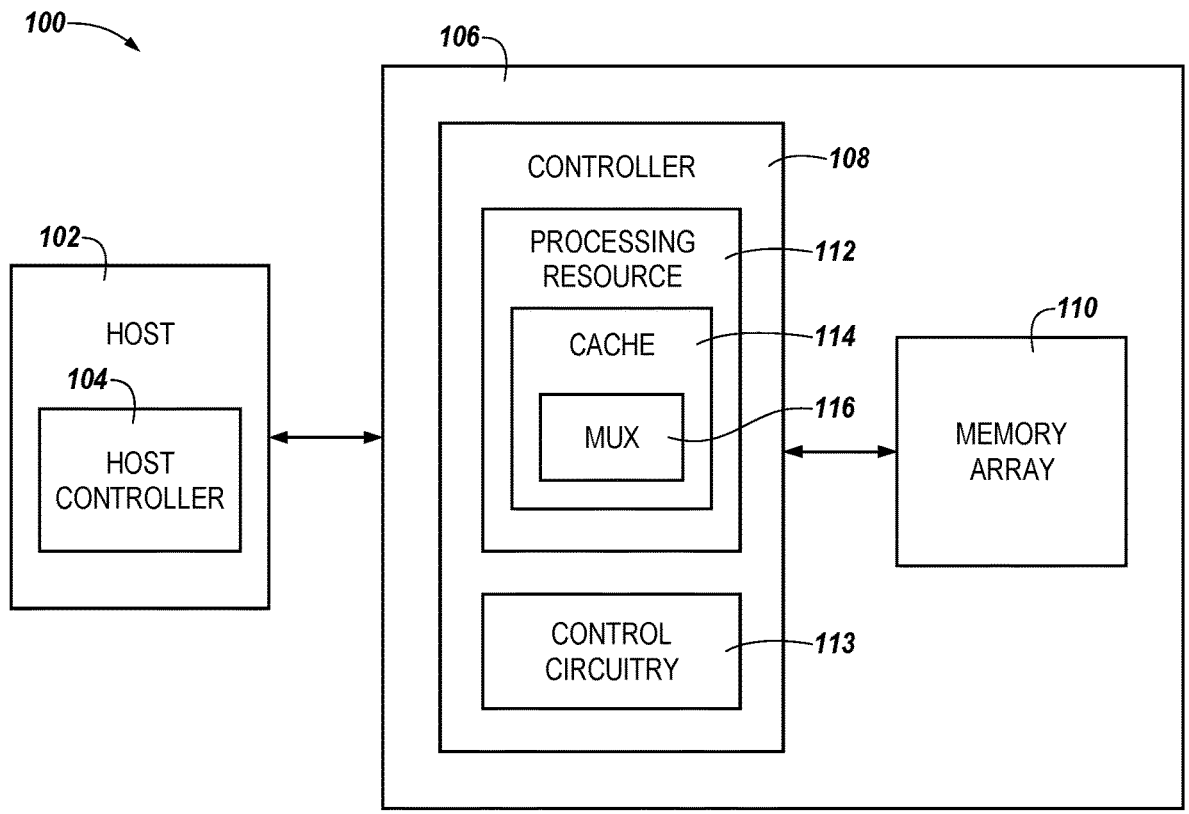
FIG. 1A is a block diagram of a system for transferring data between DRAM and SRAM in accordance with a number of embodiments of the present disclosure.

The present disclosure includes methods and apparatuses related to transferring data between DRAM and SRAM. An example method includes activating a first portion of a DRAM, reading data from the first portion of the DRAM, latching the data from the first portion of the DRAM in one or more sense amplifiers, and writing the data from the one or more sense amplifiers to a first portion of a SRAM.

In some examples, data can be transferred between the DRAM and the SRAM using a DRAM data path. For example, data can be transferred from the first portion of the DRAM to the one or more sense amplifiers via a first data path and the data can be transferred from the one or more sense amplifiers to the first portion of the SRAM via the same first data path. Similarly, data can be transferred from a first portion of the SRAM to the one or more sense amplifiers via the first data path and the data can be transferred from the one or more sense amplifiers to the first portion of the DRAM via the same first data path.

In a number of embodiments, data can be transferring between the DRAM and the SRAM using DRAM controls. For example, the SRAM can receive a DRAM command and in response data can be written from the one or more sense amplifiers to the first portion of the SRAM. The SRAM can also receive a different DRAM command and in response read the data from the SRAM.

Using a DRAM data path and/or DRAM controls to transfer data between DRAM and SRAM can reduce the number of data paths and/or circuitry on a memory device, reduce the overall size of the memory device, and/or free up space on the memory device for additional memory resources, processing resources, and/or circuitry.

As used herein, "a number of" something can refer to one or more of such things. For example, a number of memory devices can refer to one or more memory devices. A "plurality" of something intends two or more. Additionally, designators such as "U", "V", "W", "X", "Y", and "Z", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, reference numeral 323 may reference element "23" in FIG. 3A, and a similar element may be referenced as 423 in FIG. 4A. In some instances, a plurality of similar, but functionally and/or structurally distinguishable, elements or components in the same figure or in different figures may be referenced sequentially with the same element number (e.g., 118-1, 118-2, 118-3, 118-4, 118-5, 118-6, 118-7, and 118-X in FIG. 1). As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a block diagram of a system for writing data between DRAM and SRAM in accordance with a number of embodiments of the present disclosure. The system 100 can be a system in the form of a computer system, for example. The system 100 can include a host 102 and a memory device 106.

The host 102 can be coupled to or in communication with the memory device 106. The host 102 can include a host controller 104. Commands can be sent to the memory device 106 from the host controller 104. For example, the host controller 104 can send a command to read and/or write data from the memory device 106.

The memory device 106 can include a controller 108 and a memory array 110. The memory array 110 can be volatile memory. For example, the memory array 110 can be DRAM. The controller 108 can include a processing resource 112 and control circuitry 113. The processing resource 112 can be coupled to the control circuitry 113. In some examples, the processing resource 112 can be a RISC-V processor. The processing resource 112 can include a cache 114. The cache 114 can be SRAM. In some examples, the cache 114 can include two ports and a multiplexer (mux) 116. The mux 116 can allow the cache 114 to switch between the two ports. For example, the cache 114 can be coupled to the host 102 when a first port is selected by the mux 116 and the cache 114 can be coupled to the memory array 110 when a second port is selected by the mux 116.

Figure 1B:
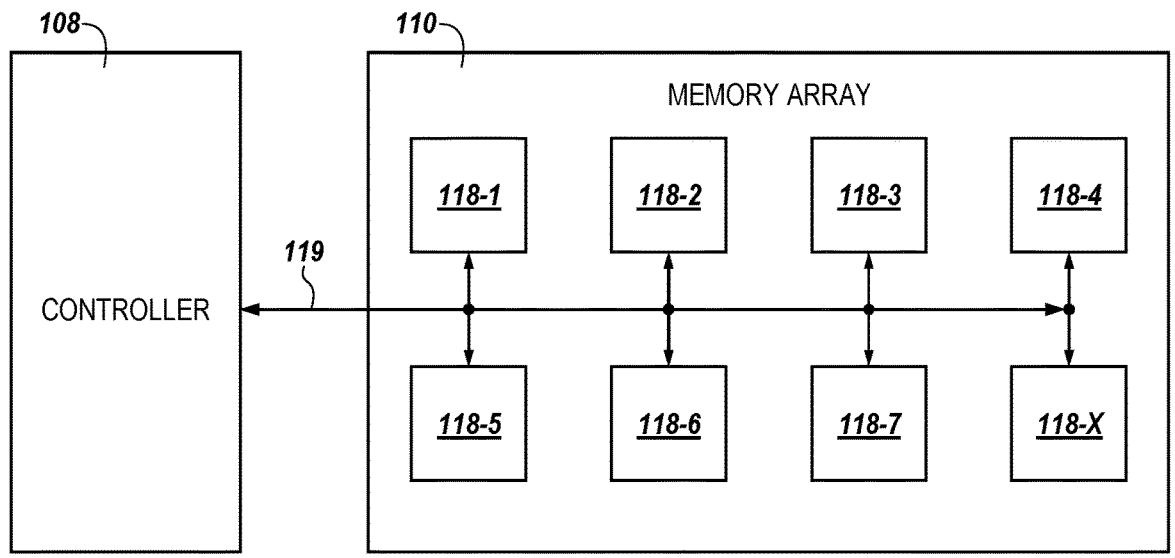
FIG. 1B is a block diagram of an apparatus for transferring data between DRAM and SRAM in accordance with a number of embodiments of the present disclosure.

FIG. 1B is a block diagram of an apparatus for writing data between DRAM and SRAM in accordance with a number of embodiments of the present disclosure. The apparatus can be, for example, memory device 106. The apparatus can include controller 108 and memory array 110, as described in FIG. 1A.

The memory array 110 can include a number of memory banks 118-1, . . . , 118-X. In some examples the number of memory banks 118-1, . . . , 118-X can be DRAM memory banks. The controller 108 can be coupled to each of the number of memory banks 118-1, . . . , 118-X via data bus 119. Read and/or write data commands can be sent via data bus 119 from the controller 108 to one or more of the number of memory banks 118-1, . . . , 118-X and one or more of the number of memory banks 118-1, . . . , 118-X can transmit data to the controller 108 via the data bus 119.

Figure 2:
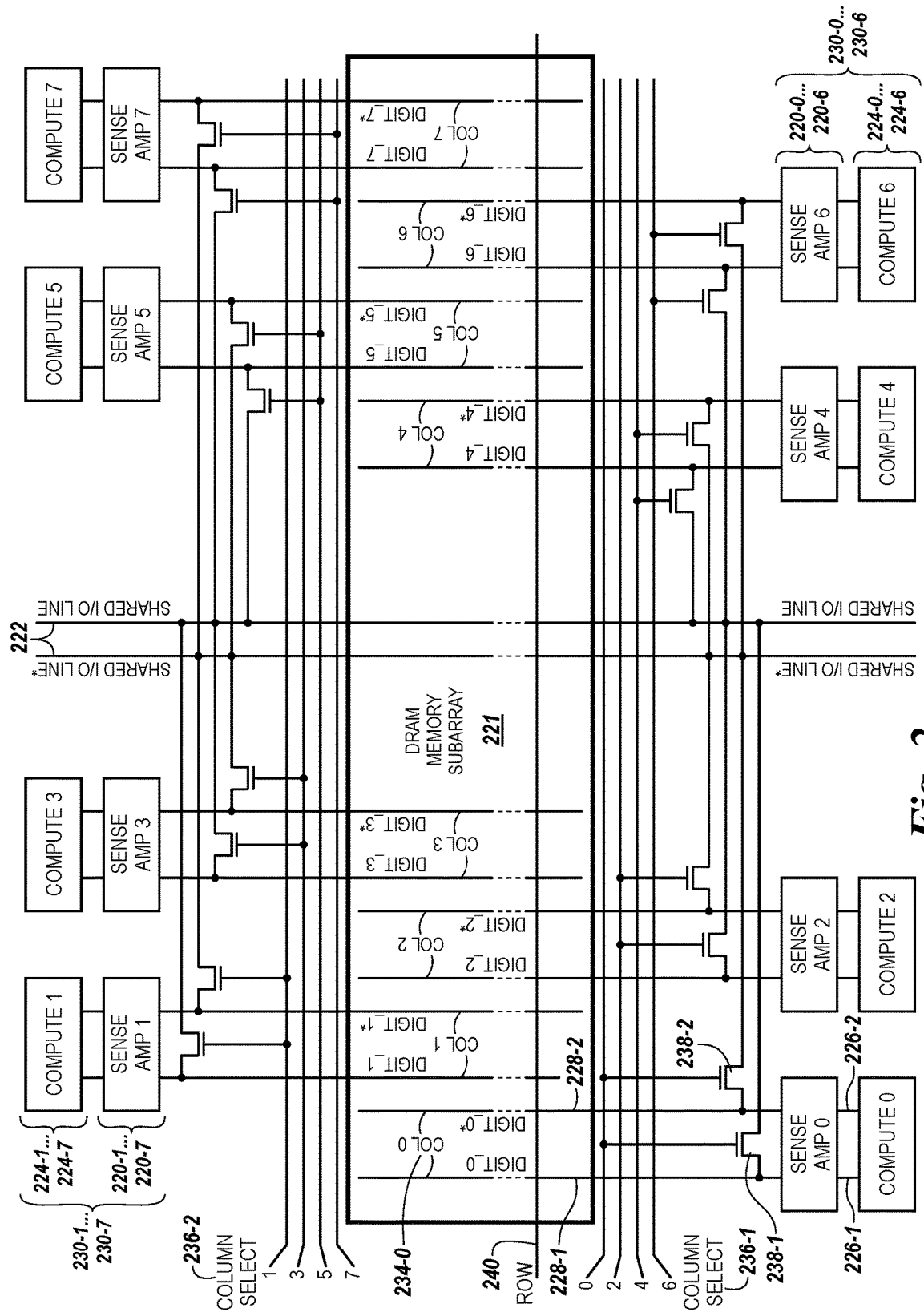
FIG. 2 is a schematic diagram illustrating circuitry for a plurality of shared I/O lines in a data path of an array in accordance with a number of embodiments of the present disclosure.

FIG. 2 is a schematic diagram illustrating circuitry for data movement in a memory device in accordance with a number of embodiments of the present disclosure. FIG. 2 shows eight sense amplifiers (e.g., sense amplifiers 0, 1, . . . , 7 shown at 220-0, 220-1, . . . , 220-7, respectively) each coupled to a respective pair of complementary shared I/O lines 222 (e.g., shared I/O line and shared I/O line*). FIG. 2 also shows eight compute components (e.g., compute components 0, 1, . . . , 7 shown at 224-0, 224-1, . . . , 224-7) each coupled to a respective sense amplifier (e.g., as shown for sense amplifier 0 at 220-0) via respective pass gates 226-1 and 226-2 and digit lines 228-1 and 228-2. The pass gates can be connected and can be controlled by an operation selection signal, Pass. For example, an output of the selection logic can be coupled to the gates of the pass gates 226-1 and 226-2 and digit lines 228-1 and 228-2. Corresponding pairs of the sense amplifiers and compute components can contribute to formation of the sensing circuitry indicated at 230-0, 230-1, . . . , 230-7.

Data values present on the pair of complementary digit lines 228-1 and 228-2 can be loaded into the compute component 224-0. For example, when the pass gates 226-1 and 226-2 are enabled, data values on the pair of complementary digit lines 228-1 and 228-2 can be passed from the sense amplifiers to the compute component (e.g., 220-0 to 224-0). The data values on the pair of complementary digit lines 228-1 and 228-2 can be the data value stored in the sense amplifier 220-0 when the sense amplifier is fired.

A combination of one sense amplifier with one compute component can contribute to the sensing circuitry (e.g., 230-0, 230-1, . . . , 230-7) of a portion of a DRAM memory subarray 221 coupled to a shared I/O line 222 shared by a number of logic stripes in a data path of the shared I/O lines 222.

The configurations of embodiments illustrated in FIG. 2 are shown for purposes of clarity and are not limited to these configurations. For instance, the configuration illustrated in FIG. 2 for the sense amplifiers 220-0, 220-1, . . . , 220-7 in combination with the compute components 224-0, 224-1, . . . , 224-7 and the shared I/O line 222 is not limited to half the combination of the sense amplifiers 220-0, 220-1, . . . , 220-7 with the compute components 224-0, 224-1, . . . , 224-7 of the sensing circuitry being formed above the columns 234 of memory cells (not shown) and half being formed below the columns 234 of memory cells. Nor are the number of such combinations of the sense amplifiers with the compute components forming the sensing circuitry configured to couple to a shared I/O line limited to eight. In addition, the configuration of the shared I/O line 222 is not limited to being split into two for separately coupling each of the two sets of complementary digit lines 228-1 and 228-2, nor is the positioning of the shared I/O line 222 limited to being in the middle of the combination of the sense amplifiers and the compute components forming the sensing circuitry (e.g., rather than being at either end of the combination of the sense amplifiers and the compute components).

The circuitry illustrated in FIG. 2 also shows column select circuitry 236-1 and 236-2 that is configured to implement data movement operations with respect to particular columns 234 of a subarray 221, the complementary digit lines 228-1 and 228-2 associated therewith, and the shared I/O line 222 (e.g., as directed by the controller 108 shown in FIGS. 1A-1B). For example, column select circuitry 236-1 has select lines 0, 2, 4, and 6 that are configured to couple with corresponding columns, such as column 0 (234-0), column 2, column 4, and column 6. Column select circuitry 236-2 has select lines 1, 3, 5, and 7 that are configured to couple with corresponding columns, such as column 1, column 3, column 5, and column 7. The column select circuitry 236 described in connection with FIG. 2 can, in various embodiments, represent at least a portion of the functionality embodied by and contained in multiplexers, e.g., an eight (8) way multiplexer, sixteen (16) way multiplexer, etc.

Controller (e.g., controller 108 in FIGS. 1A and 1B) can be coupled to column select circuitry 236 to control select lines (e.g., select line 0) to access data values stored in the sense amplifiers, compute components, and/or present on the pair of complementary digit lines (e.g., 228-1 and 228-2 when selection transistors 238-1 and 238-2 are activated via signals from select line 0). Activating the selection transistors 238-1 and 238-2 (e.g., as directed by the controller 108) enables coupling of sense amplifier 220-0, compute component 224-0, and/or complementary digit lines 228-1 and 228-2 of column 0 (234-0) to move data values on digit line 0 and digit line 0* to shared I/O line 222. For example, the moved data values may be data values from a particular row 240 stored (cached) in sense amplifier 220-0 and/or compute component 224-0. Data values from each of columns 0 through 7 can similarly be selected by controller 108 activating the appropriate selection transistors.

Moreover, enabling (e.g., activating) the selection transistors (e.g., selection transistors 238-1 and 238-2) can enable a particular sense amplifier and/or compute component (e.g., 220-0 and/or 224-0, respectively) to be coupled with a shared I/O line 222 such that data values stored by an amplifier and/or compute component can be moved to (e.g., placed on and/or transferred to) the shared I/O line 222. In some embodiments, one column at a time is selected (e.g., column 234-0) to be coupled to a particular shared I/O line 222 to move (e.g., copy, transfer, and/or transport) the stored data values. The shared I/O line 222 can be part of the data path (e.g., data path 323 in FIG. 3B and data path 423 in FIG. 4B) that transfers data between DRAM in SRAM. In the example configuration of FIG. 2, the shared I/O line 222 is illustrated as a shared, differential I/O line pair (e.g., shared I/O line and shared I/O line*). Hence, selection of column 0 (234-0) could yield two data values (e.g., two bits with values of 0 and/or 1) from a row (e.g., row 240) and/or as stored in the sense amplifier and/or compute component associated with complementary digit lines 228-1 and 228-2. These data values could be input in parallel to each shared, differential I/O pair (e.g., shared I/O and shared I/O*) of the shared differential I/O line 222.

Figure 3A:
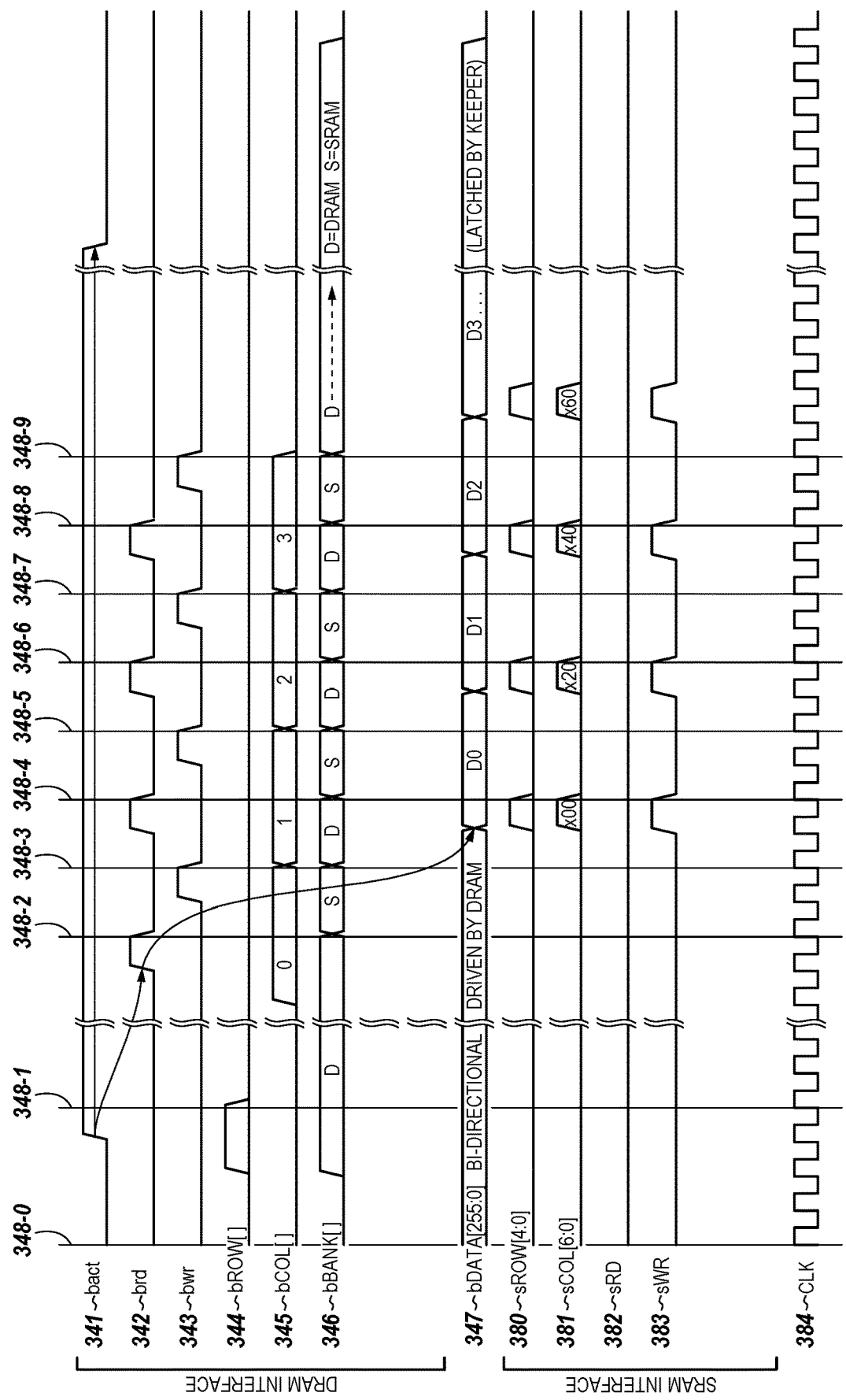
FIG. 3A is a timing diagram illustrating transferring data from DRAM to SRAM in accordance with a number of embodiments of the present disclosure.

FIG. 3A is a timing diagram illustrating writing data from DRAM to SRAM in accordance with a number of embodiments of the present disclosure. The DRAM can execute a number of commands including activating rows and/or banks 341, reading data 342, writing data 343, selecting a row 344, selecting a column 345, and selecting a Bank 346. The SRAM can also execute a number of commands including selecting a row 380, selecting a column 381, reading data 382, and writing data 383.

The process of transferring data from DRAM to SRAM can start at time 348-0 and the data can be transferred via data line (e.g., data path) 347. The time can be tracked by clock cycles 384. At time 348-1, a target bank and/or row of DRAM can be activated. A first column of data can be read from the row of DRAM at time 348-2. At time 348-3, the first column of data from the row of DRAM can be transferred to a target row in SRAM. A second column of data can be read from the row of DRAM at time 348-4. At time 348-5, the second column of data from the row of DRAM can be transferred to the target row in SRAM. A third column of data can be read from the row of DRAM at 348-6. At time 348-7, the third column of data from the row of DRAM can be transferred to the target row of SRAM. A fourth column of data can be read from the row of DRAM at 348-8. At time 348-9, the fourth column of data from the row of DRAM can be transferred to the target row of SRAM.

Figure 3B:
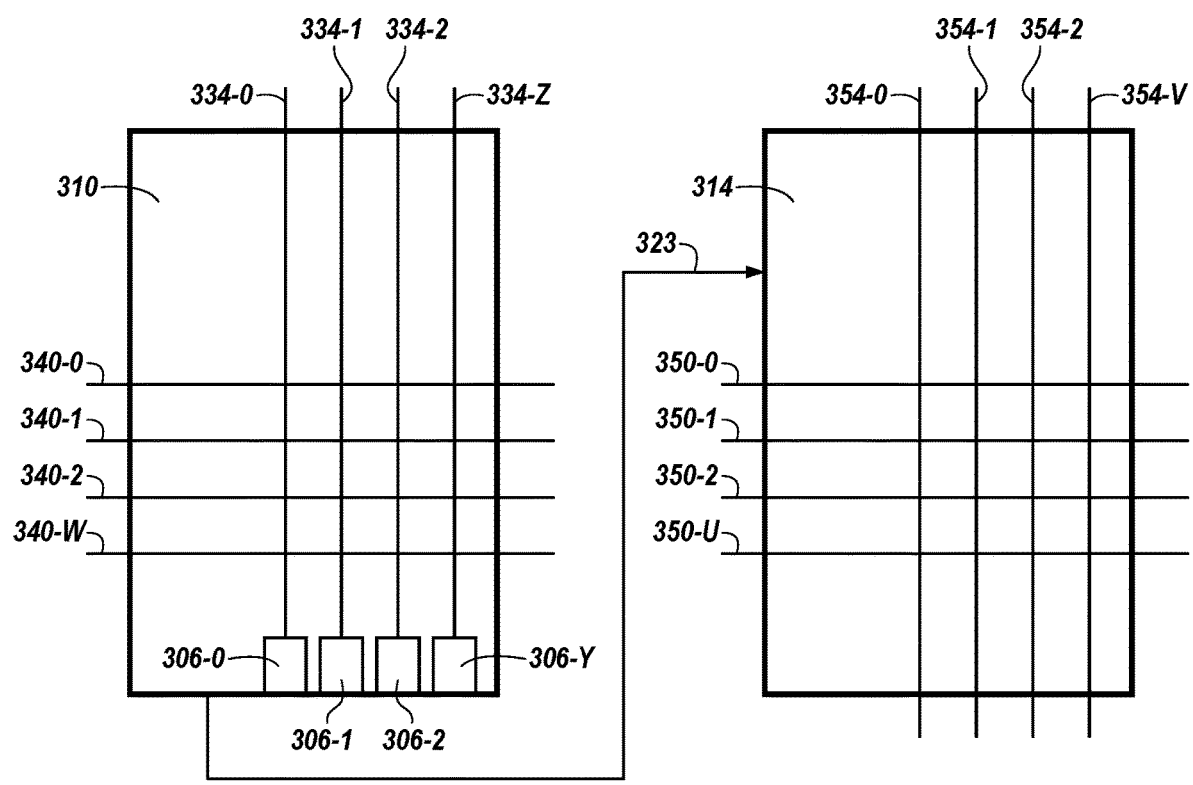
FIG. 3B is a schematic diagram illustrating circuitry for transferring data from DRAM to SRAM in accordance with a number of embodiments of the present disclosure.

FIG. 3B is a schematic diagram illustrating circuitry for transferring data from DRAM to SRAM in accordance with a number of embodiments of the present disclosure. The FIG. 3B schematic diagram can include a memory array 310 coupled to a cache 314 via data line (e.g., data path) 323. For ease of explanation and illustration of FIG. 3B, the memory array 310 can be DRAM 310 and the cache 314 can be SRAM 314. The data path for transferring data between DRAM and SRAM can include digit lines that transfer data from memory cells at intersections of rows and columns to sense amplifiers 306-0, . . . , 306-Y. The data path for transferring data between DRAM and SRAM can include data line 323 that can be coupled to sense amplifiers sense amplifiers 306-0, . . . , 306-Y. Data line 323 can also be coupled to a shared I/O line (e.g., shared I/O line 222) to transfer data between DRAM and SRAM. The data path can also include data line 323 can be coupled to and/or be part of data line 347. Data lines 323 and 347 can be coupled to the DRAM interface and SRAM interface, which can receive data and/or commands on data liens 323 and 347 and transfer the data and/or commands to components of the DRAM and SRAM.

The DRAM 310 can include a number of rows 340-0, . . . , 340-W and a number of columns 334-0, . . . , 334-Z and the SRAM 314 can include a number of rows 350-0, . . . , 350-U and a number of columns 354-0, . . . , 354-V. The DRAM 310 can also include a number of sense amplifiers 306-0, . . . , 306-Y. Memory cells can be located at the intersections of rows 340-0, . . . , 340-W and columns 334-0, . . . , 334-Z and at the intersections of rows 350-0, . . . , 350-U and columns 354-0, . . . , 354-V.

To transfer data from the DRAM 310 to the SRAM 314, one of the number of rows 340-0, . . . , 340-W of DRAM 310 can be activated, data from a memory cell coupled to one of the number of columns 334-0, . . . , 334-Z in DRAM 310 can be read and latched in one of the number of sense amplifiers 306-0, . . . , 306-Y, one of the number of rows 350-0, . . . , 350-U in SRAM 314 can be selected, and the data can be transferred to one of the number of columns 354-0, . . . , 354-V in SRAM 314. For example, row 340-0 can be activated, data from column 334-0 can be read and latched in sense amplifier 306-0, the data can be transmitted to the SRAM via data line 323, row 350-0 can be selected, and the data can be transferred to column 354-0 in the SRAM 314. Once a row is activated, data can be transferred column by column by activating columns one by one. Transferring the data can include transferring data to and/or from a memory cell coupled to the activated row and column, and repeating the process by activating additional columns of the activated row (e.g., activating and transferring data to and/or from a first column, then a second column, then a third column, etc.).

Figure 4A:
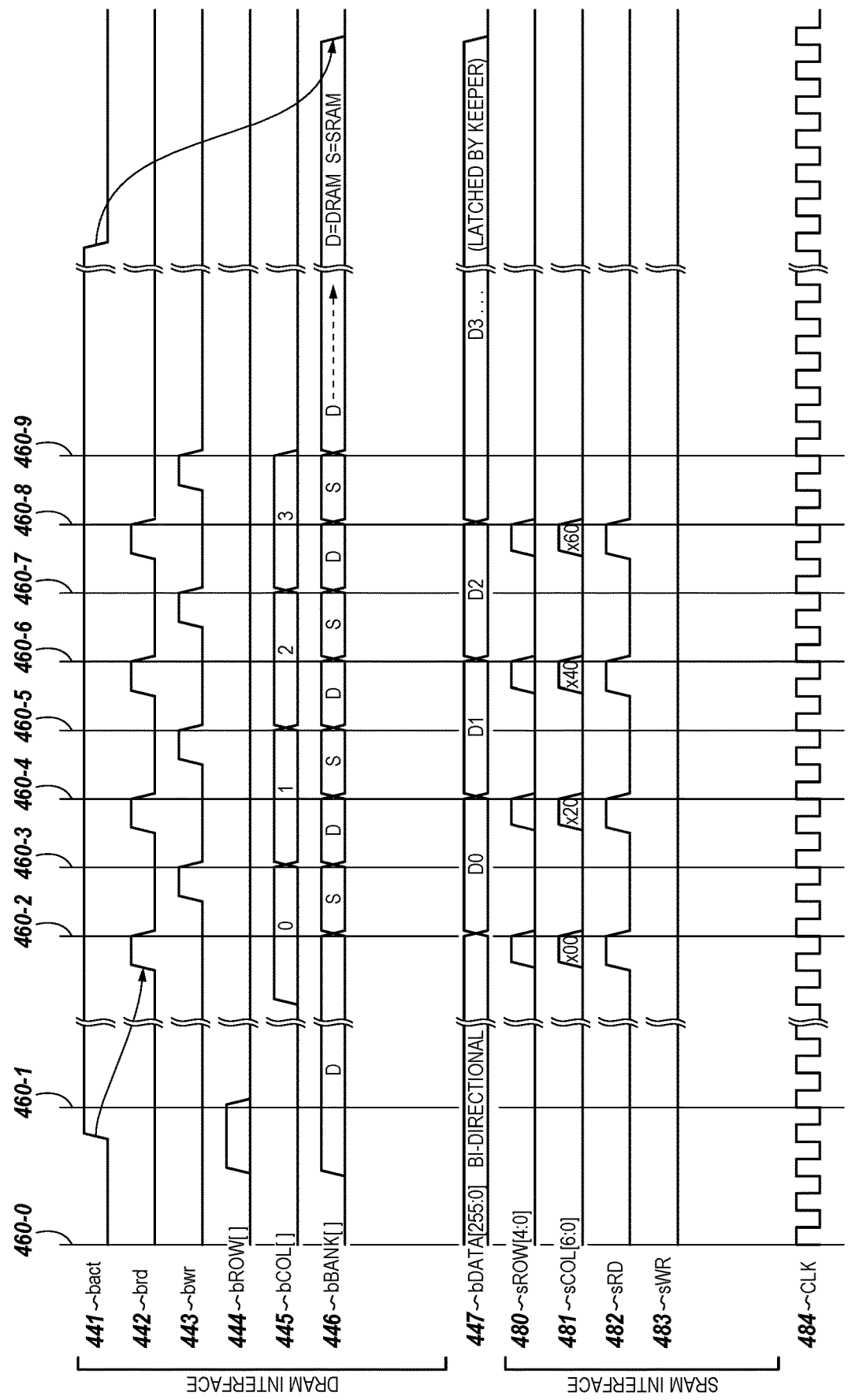
FIG. 4A is a timing diagram illustrating transferring data from SRAM to DRAM in accordance with a number of embodiments of the present disclosure.

FIG. 4A is a timing diagram illustrating transferring data from SRAM to DRAM in accordance with a number of embodiments of the present disclosure. As described in FIG. 3A, the DRAM can execute a number of commands including activating rows and/or banks 441, reading data 442, writing data 443, selecting a row 444, selecting a column 445, and selecting a Bank 446. The SRAM can also execute a number of commands including selecting a row 480, selecting a column 481, reading data 482, and writing data 483.

The process of transferring data from SRAM to DRAM can start at time 360-0 and the data can be transferred via data line (e.g., data path) 447. The time can be tracked by clock cycles 484. At time 460-1, a target bank and/or row of DRAM can be activated. A first column of data can be read from SRAM at time 460-2. At time 460-3, the first column of data from the SRAM can be transferred to the activated row in DRAM. A second column of data can be read from the SRAM at time 460-4. At time 460-5, the second column of data from SRAM can be transferred to the activated row in DRAM. A third column of data can be read from SRAM at 460-6. At time 460-7, the third column of data from the SRAM can be transferred to the activated row of DRAM. A fourth column of data can be read from SRAM at 460-8. At time 460-9, the fourth column of data from SRAM can be transferred to the activated row of DRAM.

Figure 4B:
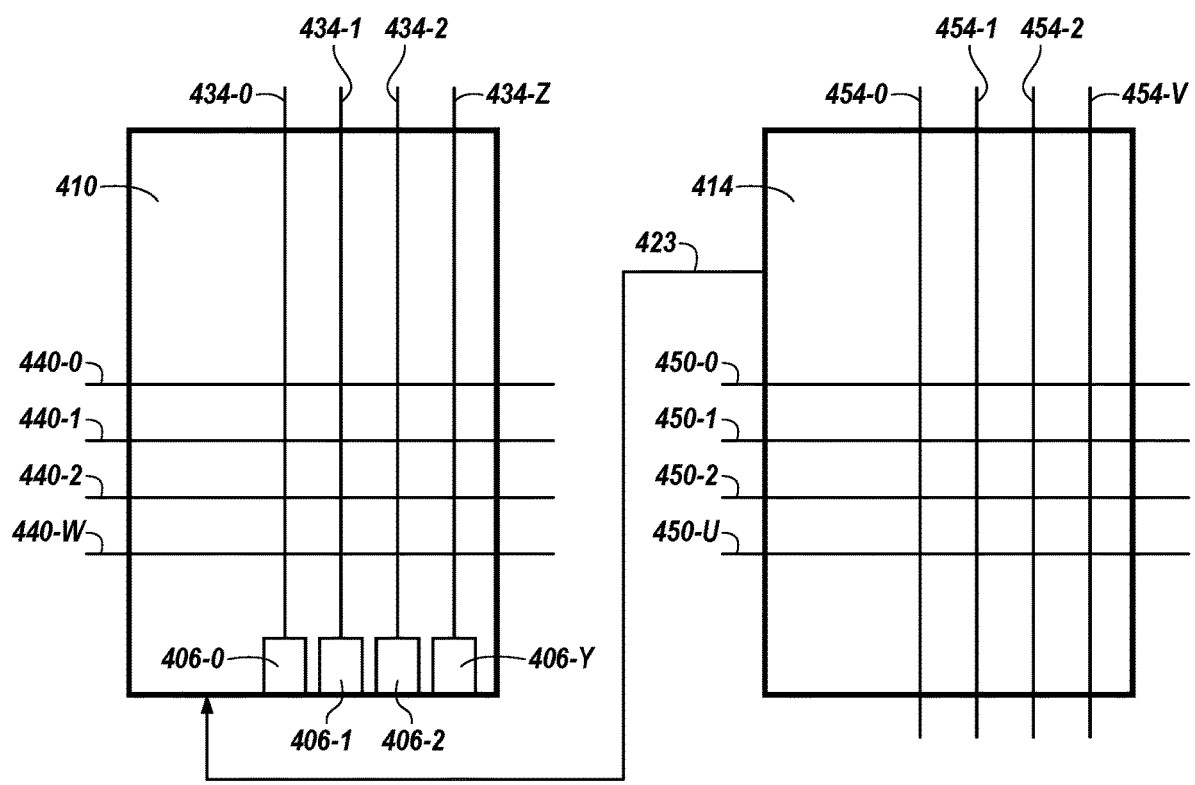
FIG. 4B is a schematic diagram illustrating circuitry for transferring data from SRAM to DRAM in accordance with a number of embodiments of the present disclosure.

FIG. 4B is a schematic diagram illustrating circuitry for transferring data from SRAM to DRAM in accordance with a number of embodiments of the present disclosure. The FIG. 4B schematic diagram can include a memory array 410 coupled to a cache 414 via data line (e.g., data path) 423. For ease of explanation and illustration of FIG. 4B, the memory array 410 can be DRAM 410 and the cache 414 can be SRAM 414.

The DRAM 410 can include a number of rows 440-0, . . . , 440-W and a number of columns 434-0, . . . , 434-Z and the SRAM 414 can include a number of rows 450-0, . . . , 450-U and a number of columns 454-0, . . . , 454-V. The DRAM 410 can also include a number of sense amplifiers 406-0, . . . , 406-Y. Memory cells can be located at the intersections of rows 440-0, . . . , 440-W and columns 434-0, . . . , 434-Z and at the intersections of rows 450-0, . . . , 450-U and columns 454-0, . . . , 454-V.

To transfer data from the SRAM 414 to the DRAM 410, one of the number of rows 440, . . . , 440-W of DRAM 410 can be activated, one of the number of rows 450-0, . . . , 450-U can be selected, data from one of the number of columns 454-0, . . . , 454-V in SRAM 414 can be read and latched in one of the number of sense amplifiers 406-0, . . . , 406-Y, and the data can be transferred to one of the number of columns 434-0, . . . , 434-Z in the DRAM 410. For example, row 440-0 can be activated, row 450-1 can be selected, data from column 454-0 can be read, transmitted to the DRAM 410 via data line 423, and latched in sense amplifier 406-2, and the data can be transferred to column 434-2 in the DRAM 410. The data path for transferring data between DRAM and SRAM can include digit lines that transfer data from sense amplifiers 406-0, . . . , 406-Y to memory cells at intersections of rows and columns. The data path for transferring data between DRAM and SRAM can include data line 423 that can be coupled to sense amplifiers sense amplifiers 406-0, . . . , 406-Y via DRAM interface. Data line 423 can also be coupled to a shared I/O line (e.g., shared I/O line 222) to transfer data between DRAM and SRAM. The data path can also include data line 423 can be coupled to and/or be part of data line 447. Data lines 423 and 447 can be coupled to the DRAM interface and SRAM interface, which can receive data and/or commands on data lines 423 and 447 and transfer the data and/or commands to components of the DRAM and SRAM.

Once a row is activated, data can be transferred column by column by activating columns one by one. Transferring the data can include transferring data to and/or from a memory cell coupled to the activated row and column, and repeating the process by activating additional columns of the activated row (e.g., activating and transferring data to and/or from a first column, then a second column, then a third column, etc.).

Figure 5:
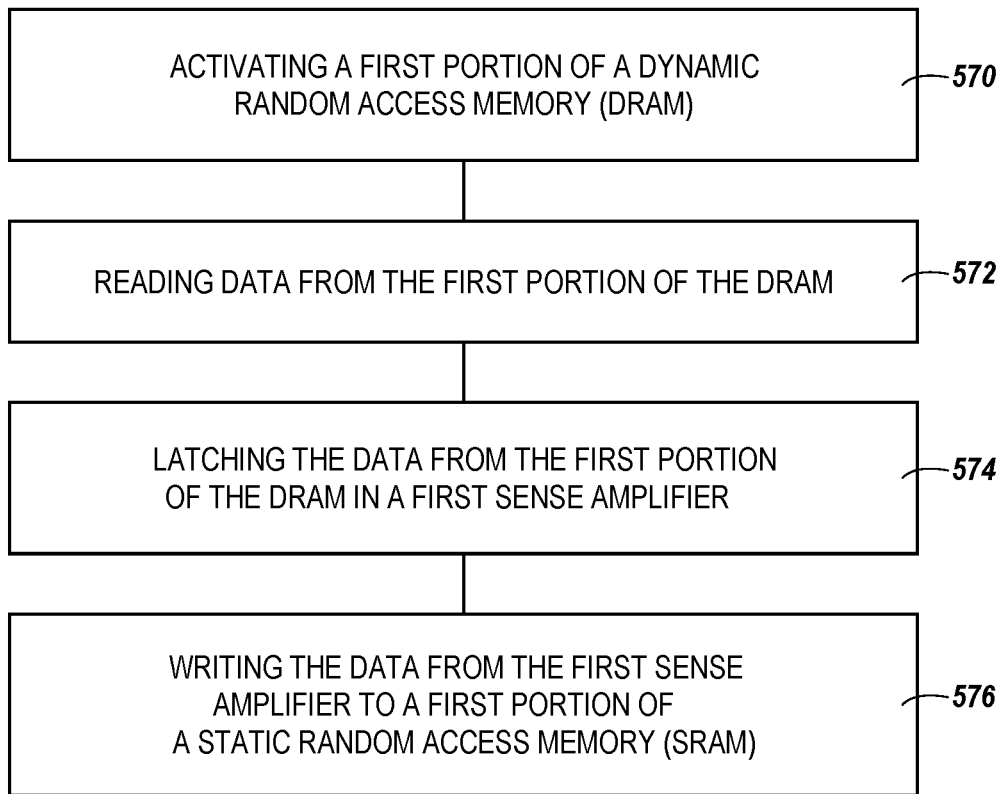
FIG. 5 is a flow diagram of a method for transferring data from DRAM to SRAM in accordance with a number of embodiments of the present disclosure.

FIG. 5 is a flow diagram of a method for transferring data from DRAM to SRAM in accordance with a number of embodiments of the present disclosure.

At block 570, the method can include activating a first portion of a dynamic random access memory (DRAM). Activating the first portion of the DRAM can include activating a bank in the DRAM and/or a row in the DRAM.

At block 572, the method can include reading data from the first portion of the DRAM. The data can be read from the first portion of the DRAM in response to the DRAM receiving a command.

At block 574, the method can include latching the data from the first portion of the DRAM in a first sense amplifier of one or more sense amplifiers. A data bus can couple the DRAM and the one or more sense amplifiers.

At block 576, the method can include transferring the data from the first sense amplifier to a first portion of a static random access memory (SRAM). The data bus can couple the one or more sense amplifiers and the SRAM. transferring the data from the one or more sense amplifiers to the first portion of the SRAM can include writing the data to a row of the SRAM. The SRAM can transfer the data from the one or more sense amplifiers to the first portion of the SRAM in response to receiving a DRAM command. The DRAM command can be from a DRAM controller. In some examples, the DRAM command can be converted to a SRAM command. The converted DRAM command can be executed to read and/or write data column by column on an activated row of the SRAM.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for performing a data transfer operation, comprising:
    activating a first portion of a dynamic random access memory (DRAM);
    reading data from the first portion of the DRAM;
    latching the data from the first portion of the DRAM in a first sense amplifier of one or more sense amplifiers; and
    writing the data from the first sense amplifier to a first portion of a static random access memory (SRAM) in response to receiving a DRAM command at the SRAM.

2. The method of claim 1, wherein activating the first portion of the DRAM comprises:
    activating a bank in the DRAM; and
    activating a row in the DRAM; and
    a first column in the DRAM.

3. The method of claim 1, wherein writing the data from the first sense amplifier to the first portion of the SRAM comprises writing the data to a row of the SRAM.

4. The method of claim 1, further comprising:
    activating a second portion of the DRAM;
    reading a second portion of data from a second portion of the SRAM;
    latching the second portion of data from the second portion of the SRAM in a second sense amplifier of the one or more sense amplifiers; and writing the second portion of data from the second sense amplifier to the second portion of the DRAM.

5. The method of claim 4, wherein activating the second portion of the DRAM includes activating a second column of the DRAM.

6. The method of claim 1, further comprising transferring the data from the first portion of the DRAM to the first sense amplifier via a first data path and transferring the data from the first sense amplifier to the first portion of the SRAM via the first data path.

7. The method of claim 1, further comprising converting the DRAM command to a SRAM command.

8. A method, comprising:
    activating a first portion of a dynamic random access memory (DRAM);
    reading a first portion of data from a first portion of a static random access memory (SRAM) in response to receiving a DRAM command at the SRAM;
    latching the first portion of data from the first portion of the SRAM in a first sense amplifier of one or more sense amplifiers; and
    writing the first portion of data from the one or more sense amplifiers to the first portion of the DRAM.

9. The method of claim 8, wherein activating the first portion of the DRAM comprises:
    activating a bank of the DRAM; and
    activating a row of the DRAM.

10. The method of claim 8, wherein writing the first portion of data from the first sense amplifier of the one or more sense amplifiers to the first portion of the DRAM comprises writing the data to a column of the DRAM.

11. The method of claim 8, further comprising:
    activating a second portion of the DRAM;
    reading a second portion of data from the second portion of the SRAM;
    latching the second portion of data from the second portion of the DRAM in a second sense amplifier of the one or more sense amplifiers; and
    writing the second portion of data from the second sense amplifier of the one or more sense amplifiers to a second portion of the SRAM.

12. The method of claim 8, further comprising transferring the first portion of data from the first portion of the SRAM to the first sense amplifier of the one or more sense amplifiers via a first data path and transferring the data from the first sense amplifier of the one or more sense amplifiers to the first portion of the DRAM via the first data path.

13. The method of claim 8, further comprising converting the DRAM command to a SRAM command.

14. An apparatus, comprising:
    a dynamic random access memory (DRAM) including one or more sense amplifiers; and
    a static random access memory (SRAM) coupled to the DRAM, wherein the SRAM comprises two ports, and wherein the apparatus is configured to:
    activate a DRAM row;
    read data from a column of the DRAM row;
    latch the data from the DRAM row in a first sense amplifier of the one or more sense amplifiers; and
    write the data from the first sense amplifier of the one or more sense amplifiers to a SRAM row.

15. The apparatus of claim 14, wherein the two ports are multiplexed.

16. The apparatus of claim 14, further comprising:
    a RISC-V processor, wherein the RISC-V processor includes the SRAM.

17. The apparatus of claim 14, further comprising:
    a data bus coupling the one or more sense amplifiers of the DRAM and the SRAM.

18. The apparatus of claim 17, further comprising:
    a controller configured to:
        send a command to the DRAM and the SRAM via the data bus.

19. The apparatus of claim 18, wherein the DRAM is configured to activate the DRAM row and read the data from the DRAM row in response to receiving the command from the controller.

20. The apparatus of claim 18, wherein the SRAM is configured to write the data from the one or more sense amplifiers to the SRAM row in response to receiving the command from the controller.

21. An apparatus, comprising:
    a dynamic random access memory (DRAM) including one or more sense amplifiers; and
    a static random access memory (SRAM) coupled to the one or more sense amplifiers of the DRAM via a data bus, wherein the apparatus is configured to:
    activate a DRAM row;
    read data from a SRAM row in response to receiving a DRAM command;
    latch the data from the SRAM row in a first sense amplifier of the one or more sense amplifiers; and
    write the data from the first sense amplifier of the one or more sense amplifiers to a column of the DRAM row.

22. The apparatus of claim 21, further comprising:
    a processor including cache, wherein the cache is the SRAM.

* * * * *